(12) United States Patent
Cheng et al.

(10) Patent No.: US 12,432,961 B2
(45) Date of Patent: Sep. 30, 2025

(54) INTEGRATED STRUCTURE OF MOS TRANSISTORS HAVING DIFFERENT WORKING VOLTAGES AND METHOD FOR MANUFACTURING SAME

(71) Applicant: Shanghai Huali Integrated Circuit Corporation, Shanghai (CN)

(72) Inventors: Qi Cheng, Shanghai (CN); Haihua Zou, Shanghai (CN); Zhenxing Yang, Shanghai (CN); Tao Liu, Shanghai (CN); Qiwei Wang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 349 days.

(21) Appl. No.: 18/174,767

(22) Filed: Feb. 27, 2023

(65) Prior Publication Data
US 2023/0335641 A1    Oct. 19, 2023

(30) Foreign Application Priority Data
Apr. 14, 2022    (CN) .......................... 202210395908.1

(51) Int. Cl.
| | |
|---|---|
| *H10D 30/60* | (2025.01) |
| *H01L 21/311* | (2006.01) |
| *H01L 21/762* | (2006.01) |
| *H10D 62/10* | (2025.01) |
| *H10D 64/01* | (2025.01) |

(52) U.S. Cl.
CPC ...... *H10D 30/601* (2025.01); *H01L 21/31111* (2013.01); *H01L 21/76243* (2013.01); *H10D 62/102* (2025.01); *H10D 64/021* (2025.01)

(58) Field of Classification Search
CPC .. H10D 30/601; H10D 62/102; H10D 64/021; H01L 21/31111; H01L 21/76243
See application file for complete search history.

(56) References Cited

U.S. PATENT DOCUMENTS

| | | | | |
|---|---|---|---|---|
| 9,142,566 | B2 * | 9/2015 | Hong | H10D 30/0227 |
| 9,224,826 | B2 * | 12/2015 | Kwon | H10D 84/0144 |
| 11,302,691 | B2 * | 4/2022 | Thei | H10D 64/514 |
| 2003/0015763 | A1 * | 1/2003 | Yoneda | H10D 84/0181 |
| | | | | 257/E21.639 |
| 2014/0091400 | A1 * | 4/2014 | Lee | H10D 64/681 |
| | | | | 257/392 |
| 2017/0154822 | A1 * | 6/2017 | Kalnitsky | H01L 21/0217 |
| 2023/0320089 | A1 * | 10/2023 | Shu | H10D 84/038 |
| | | | | 257/314 |

* cited by examiner

*Primary Examiner* — Zandra V Smith
*Assistant Examiner* — John M Parker
(74) *Attorney, Agent, or Firm* — Banner & Witcoff, Ltd.

(57) ABSTRACT

The present application discloses an integrated structure of MOS transistors having different working voltages. A second spacer of a second MOS transistor having a middle second working voltage is formed by adding a third sub-spacer on the basis of a first spacer of a first MOS transistor having a relatively low first working voltage, and the first spacer is formed by stacking a first sub-spacer and a second sub-spacer. The thickness of the second spacer is adjusted via the third sub-spacer, so as to ensure that a GIDL leakage of the second MOS transistor under the second working voltage satisfies a requirement. The present application also discloses a method for manufacturing an integrated structure of MOS transistors having different working voltages.

16 Claims, 5 Drawing Sheets

INTEGRATED STRUCTURE OF MOS TRANSISTORS HAVING DIFFERENT WORKING VOLTAGES AND METHOD FOR MANUFACTURING SAME

CROSS-REFERENCE TO RELATED APPLICATIONS

This application claims the priority to Chinese Patent Application No. 202210395908.1, filed on Apr. 14, 2022, the disclosure of which is incorporated herein by reference in its entirety.

TECHNICAL FIELD

The present application relates to the field of semiconductor integrated circuit manufacturing, in particular to an integrated structure of metal-oxide-semiconductor (MOS) transistors having different working voltages. The present application also relates to a method for manufacturing an integrated structure of MOS transistors having different working voltages.

BACKGROUND

FIGS. 1A-1C are schematic diagrams of device structures in steps of an existing method for manufacturing an integrated structure of MOS transistors having different working voltages. The existing method for manufacturing an integrated structure of MOS transistors having different working voltages includes the following steps:

Step 1. Referring to FIG. 1A, a first gate structure, a second gate structure, and a third gate structure are formed respectively in a region for forming a first MOS transistor, a region for forming a second MOS transistor, and a region for forming a third MOS transistor on a semiconductor substrate 101.

In FIG. 1A, region 1 represents the region for forming the first MOS transistor, region 2 represents the region for forming the second MOS transistor, and region 3 represents the region for forming the third MOS transistor. Generally, a plurality of the first MOS transistors are formed in the region 1, and only one of the first MOS transistors is shown in FIG. 1A. Similarly, a plurality of the second MOS transistors may be integrated in the region 2, and a plurality of the third MOS transistors may be integrated in the region 3.

The first MOS transistor has a first working voltage, the second MOS transistor has a second working voltage, and the third MOS transistor has a third working voltage. The third working voltage is greater than the second working voltage, and the second working voltage is greater than the first working voltage. The third working voltage is a high voltage (HV), the second working voltage is a medium voltage (MV), and the first working voltage is a low voltage (LV). Generally, the first MOS transistor is referred to as an LV device, the second MOS transistor is referred to as an MV device, and the third MOS transistor is referred to as an HV device. The LV device is usually applied in a core device region, such as an SRAM storage region, and the LV device has the characteristics of low working voltage and high integration. The MV device is usually applied in an input-output (10) region. The HV device is applied in a region that requires voltage withstanding.

The first gate structure is formed by stacking a first gate dielectric layer 103a and a first gate conductive material layer 104a. The second gate structure is formed by stacking a second gate dielectric layer 103b and a second gate conductive material layer 104b. The third gate structure is formed by stacking a third gate dielectric layer 103c and a third gate conductive material layer 104c.

The thickness of the second gate dielectric layer 103b is greater than the thickness of the first gate dielectric layer 103a, and the thickness of the third gate dielectric layer 103c is greater than the thickness of the second gate dielectric layer 103b.

The first gate dielectric layer 103a, the second gate dielectric layer 103b, and the third gate dielectric layer 103c are usually formed independently to satisfy respective thickness requirements.

Generally, the first gate conductive material layer 104a, the second gate conductive material layer 104b, and the third gate conductive material layer 104c are all polysilicon gates and are formed simultaneously by means of polysilicon deposition and patterned etching.

Step 2. Referring to FIG. 1A, a first sub-spacer 105 is formed on side surfaces of the first gate structure, the second gate structure, and the third gate structure.

Generally, the material of the first sub-spacer 105 includes silicon oxide. The first sub-spacer 105 can be formed by directly oxidizing the polysilicon gate. Since the first sub-spacers 105 of the first gate structure, the second gate structure, and the third gate structure are formed simultaneously using the same process at different positions, these sub-spacers are all represented by the mark 105.

Step 3. Referring to FIG. 1B, a second sub-spacer material layer 106a is deposited. The second sub-spacer material layer 106a covers the top surface, side surface, and external surface of the first to third gate structures.

Step 4. Referring to FIG. 1C, the second sub-spacer material layer 106a is fully etched so that the second sub-spacer material layer 106a is retained on the side surfaces of the first gate structure, the second gate structure, and the third gate structure in a self-aligned manner and forms a second sub-spacer 106.

It can be seen from FIG. 1C that spacers of the first gate structure, the second gate structure, and the third gate structure each are formed by stacking the first sub-spacer 105 and the second sub-spacer 106.

Generally, the thickness of the spacer needs to satisfy the requirements of the core device region. By reducing the thickness of the spacer, the dimension of the LV device can be reduced, thus improving the integration of the core device region. In the MV device, an existing integrated structure is prone to gate-induced drain leakage (GIDL). Generally, Ioff of the MV device needs to be less than 10 pA/μm; however, the actual Ioff is greater than 100 pA/μm. Since Ioff is mainly provided by the GIDL leakage, it is necessary to further reduce the GIDL leakage of the MV device.

BRIEF SUMMARY

According to some embodiments in this application, in the integrated structure of MOS transistors having different working voltages provided by the present application, a first MOS transistor having a first working voltage, a second MOS transistor having a second working voltage, and a third MOS transistor having a third working voltage are simultaneously integrated on a semiconductor substrate; the third working voltage is greater than the second working voltage, and the second working voltage is greater than the first working voltage.

The first MOS transistor has a first gate structure, the second MOS transistor has a second gate structure, and the third MOS transistor has a third gate structure.

The first gate structure is formed by stacking a first gate dielectric layer and a first gate conductive material layer, the second gate structure is formed by stacking a second gate dielectric layer and a second gate conductive material layer, and the third gate structure is formed by stacking a third gate dielectric layer and a third gate conductive material layer.

The thickness of the second gate dielectric layer is greater than the thickness of the first gate dielectric layer, and the thickness of the third gate dielectric layer is greater than the thickness of the second gate dielectric layer.

A first spacer formed by stacking a first sub-spacer and a second sub-spacer is formed on a side surface of the first gate structure in a self-aligned manner.

A second spacer formed by stacking the first sub-spacer, the second sub-spacer, and a third sub-spacer is formed on a side surface of the second gate structure in a self-aligned manner.

A third spacer is formed on a side surface of the third gate structure in a self-aligned manner, the third spacer being formed by stacking the first sub-spacer and the second sub-spacer or by stacking the first sub-spacer, the second sub-spacer, and the third sub-spacer.

On the basis of the thickness of the first spacer, the thickness of the second spacer is adjusted via the third sub-spacer, so as to ensure that a GIDL leakage of the second MOS transistor under the second working voltage satisfies a requirement, wherein a smaller thickness of the second spacer corresponds to a smaller GIDL leakage of the second MOS transistor.

In some cases, the second MOS transistor further includes:
  a second drift region formed in the semiconductor substrate on two sides of the second gate structure, the second drift region being self-aligned with a side surface of the first sub-spacer, and the second drift region diffusing and extending to the bottom of the second gate structure; and
  a second source drain region formed in the second drift region on two sides of the second gate structure, the second source drain region being self-aligned with a side surface of the second spacer, wherein a junction depth of the second drift region is greater than a junction depth of the second source drain region, and a doping concentration of the second source drain region is greater than a doping concentration of the second drift region.

In some cases, a condition where the GIDL leakage of the second MOS transistor satisfies the requirement is that the GIDL leakage of the second MOS transistor is less than 10 pA/μm.

In some cases, the first MOS transistor further includes:
  a first light doped drain region formed in the semiconductor substrate on two sides of the first gate structure, the first light doped drain region being self-aligned with the side surface of the first sub-spacer; and
  a first source drain region formed in the semiconductor substrate on two sides of the first gate structure, the first source drain region being self-aligned with a side surface of the first spacer, wherein a junction depth of the first light doped drain region is less than a junction depth of the first source drain region, and a doping concentration of the first source drain region is greater than a doping concentration of the first light doped drain region.

In some cases, the width of the first gate structure is less than the width of the second gate structure.

A spacing between the first gate structures is less than a spacing between the second gate structures.

In a region for forming the first MOS transistor, the first MOS transistors are arranged periodically, and the thickness of the first spacer ensures that the cell dimension of the first MOS transistor in a channel length direction satisfies a requirement, so as to improve the integration of the first MOS transistors, wherein a smaller thickness of the first spacer corresponds to a smaller cell dimension of the first MOS transistor in the channel length direction.

In some cases, the third MOS transistor further includes:
  a third drift region formed in the semiconductor substrate on two sides of the third gate structure, the third drift region being self-aligned with the side surface of the first sub-spacer, and the third drift region diffusing and extending to the bottom of the third gate structure; and
  a third source drain region formed in the third drift region, wherein a junction depth of the third drift region is greater than a junction depth of the third source drain region, and a doping concentration of the third source drain region is greater than a doping concentration of the third drift region.

A drift region field oxide is formed in the third drift region between the third source drain region and the side surface of the third gate structure.

In some cases, the material of the first sub-spacer includes silicon oxide.

The material of the second sub-spacer includes silicon nitride or a low dielectric constant material.

The material of the third sub-spacer includes silicon oxide.

In some cases, the first gate conductive material layer, the second gate conductive material layer, and the third gate conductive material layer are all polysilicon gates or metal gates.

In order to solve the above technical problem, the method for manufacturing an integrated structure of MOS transistors having different working voltages provided by the present application includes the following steps:
  step 1, forming a first gate structure, a second gate structure, and a third gate structure respectively in a region for forming a first MOS transistor, a region for forming a second MOS transistor, and a region for forming a third MOS transistor on a semiconductor substrate; wherein
  the first MOS transistor has a first working voltage, the second MOS transistor has a second working voltage, and the third MOS transistor has a third working voltage; the third working voltage is greater than the second working voltage, and the second working voltage is greater than the first working voltage;
  the first gate structure is formed by stacking a first gate dielectric layer and a first gate conductive material layer, the second gate structure is formed by stacking a second gate dielectric layer and a second gate conductive material layer, and the third gate structure is formed by stacking a third gate dielectric layer and a third gate conductive material layer; and
  the thickness of the second gate dielectric layer is greater than the thickness of the first gate dielectric layer, and the thickness of the third gate dielectric layer is greater than the thickness of the second gate dielectric layer;
  step 2, forming a first sub-spacer on side surfaces of the first gate structure, the second gate structure, and the third gate structure;

step 3, sequentially depositing a second sub-spacer material layer and a third sub-spacer material layer;

step 5, fully etching the third sub-spacer material layer, such that the third sub-spacer material layer is retained on the side surfaces of the first gate structure, the second gate structure, and the third gate structure in a self-aligned manner and forms a third sub-spacer;

step 6, forming a mask layer to cover the region for forming the second MOS transistor, open the region for forming the first MOS transistor, and cover or open the region for forming the third MOS transistor;

step 7, performing wet etching to fully remove the third sub-spacer in an open region of the mask layer; and step 8, fully etching the second sub-spacer material layer, such that the second sub-spacer material layer is retained on the side surfaces of the first gate structure, the second gate structure, and the third gate structure in a self-aligned manner and forms a second sub-spacer; wherein a first spacer is formed by stacking the first sub-spacer and the second sub-spacer that are formed on the side surface of the first gate structure in a self-aligned manner;

a second spacer is formed by stacking the first sub-spacer, the second sub-spacer, and the third sub-spacer that are formed on the side surface of the second gate structure in a self-aligned manner;

a third spacer is formed by stacking the first sub-spacer and the second sub-spacer or by stacking the first sub-spacer, the second sub-spacer, and the third sub-spacer; and on the basis of the thickness of the first spacer, the thickness of the second spacer is adjusted via the third sub-spacer, so as to ensure that a GIDL leakage of the second MOS transistor under the second working voltage satisfies a requirement, wherein a smaller thickness of the second spacer corresponds to a smaller GIDL leakage of the second MOS transistor.

In some cases, a process of forming the second MOS transistor further includes:

after formation of the first sub-spacer in step 2, forming a second drift region in the semiconductor substrate on two sides of the second gate structure by means of ion implantation and annealing diffusion processes, wherein the ion implantation of the second drift region uses a side surface of the first sub-spacer as a self-alignment condition, and the second drift region extends to the bottom of the second gate structure after the annealing diffusion; and after step 8, performing source drain implantation to form a second source drain region in the second drift region on two sides of the second gate structure, the second source drain region being self-aligned with a side surface of the second spacer, wherein a junction depth of the second drift region is greater than a junction depth of the second source drain region, and a doping concentration of the second source drain region is greater than a doping concentration of the second drift region.

In some cases, a condition where the GIDL leakage of the second MOS transistor satisfies the requirement is that the GIDL leakage of the second MOS transistor is less than 10 pA/μm.

In some cases, a process of forming the first MOS transistor further includes:

after formation of the first sub-spacer in step 2, performing light doped drain implantation to form a first light doped drain region in the semiconductor substrate on two sides of the first gate structure, wherein the light doped drain implantation of the first light doped drain region uses the side surface of the first sub-spacer as a self-alignment condition;

after step 8, performing source drain implantation to form a first source drain region in the semiconductor substrate on two sides of the first gate structure, the first source drain region being self-aligned with a side surface of the first spacer, wherein a junction depth of the first light doped drain region is less than a junction depth of the first source drain region, and a doping concentration of the first source drain region is greater than a doping concentration of the first light doped drain region.

In some cases, the width of the first gate structure is less than the width of the second gate structure.

A spacing between the first gate structures is less than a spacing between the second gate structures.

In the region for forming the first MOS transistor, the first MOS transistors are arranged periodically, and the thickness of the first spacer ensures that the cell dimension of the first MOS transistor in a channel length direction satisfies a requirement, so as to improve the integration of the first MOS transistors, wherein a smaller thickness of the first spacer corresponds to a smaller cell dimension of the first MOS transistor in the channel length direction.

In some cases, the third MOS transistor further includes:

before step 1, forming a drift region field oxide of the third MOS transistor on the semiconductor substrate;

after formation of the first sub-spacer in step 2, forming a third drift region in the semiconductor substrate on two sides of the third gate structure by means of ion implantation and annealing diffusion processes, wherein the ion implantation of the third drift region uses the side surface of the first sub-spacer as a self-alignment condition, and the third drift region extends to the bottom of the third gate structure after the annealing diffusion; and after step 8, performing source drain implantation to form a third source drain region in the third drift region on two sides of the third gate structure, wherein a junction depth of the third drift region is greater than a junction depth of the third source drain region, and a doping concentration of the third source drain region is greater than a doping concentration of the third drift region; and the drift region field oxide is formed in the third drift region between the third source drain region and the side surface of the third gate structure.

In some cases, the material of the first sub-spacer includes silicon oxide.

The material of the second sub-spacer includes silicon nitride or a low dielectric constant material.

The material of the third sub-spacer includes silicon oxide.

In some cases, in step 6, a mask for defining a region for forming the second gate dielectric layer in step 1 is used to define a pattern structure of the mask layer.

In the present application, the second spacer of the second MOS transistor having the second working voltage is formed by adding the third sub-spacer on the basis of the first spacer including the first sub-spacer and the second sub-spacer, of the first MOS transistor having the first working voltage. The first sub-spacer and the second sub-spacer can ensure that the thickness of the first spacer is relatively small, so that the dimension of the first MOS transistor can be reduced and the device density of the region for forming the first MOS transistor can be improved. In this case, the thickness of the second spacer can be independently adjusted via the third sub-spacer, increasing a spacing between the second source drain region and the second gate conductive material layer of the second MOS transistor and thus reducing the GIDL leakage of the second MOS transistor.

In the present application, the third sub-spacer of the second MOS transistor can be formed by adding a mask after deposition and full etching of the third sub-spacer material layer and then performing wet etching.

In the present application, the mask for defining the region for forming the second gate dielectric layer can be used as the mask for forming the third sub-spacer of the second MOS transistor, thus requiring no additional masks. The mask for defining the region for forming the second gate dielectric layer is also referred to as a dual gate (DG) layer mask.

BRIEF DESCRIPTION OF THE DRAWINGS

The present application is described in detail below with reference to the drawings and specific implementations.

DETAILED DESCRIPTION OF THE DISCLOSURE

Figure 1A:
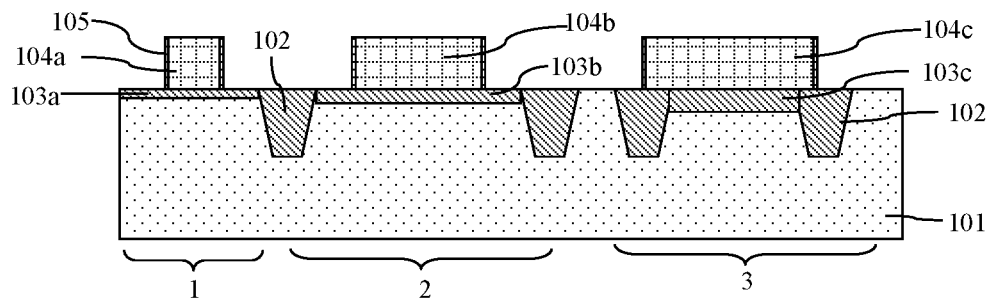
FIGS. 1A-1C are schematic diagrams of device structures in steps of an existing method for manufacturing an integrated structure of MOS transistors having different working voltages.
Figure 1B:
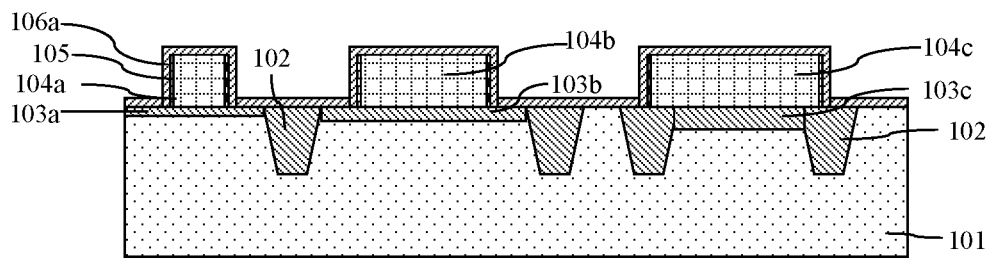
Figure 1C:
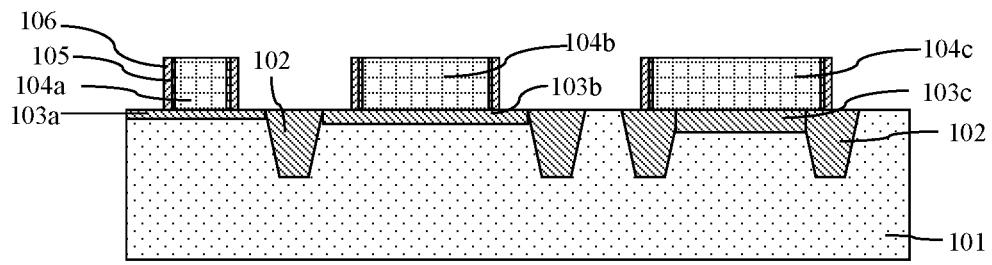
Figure 2:
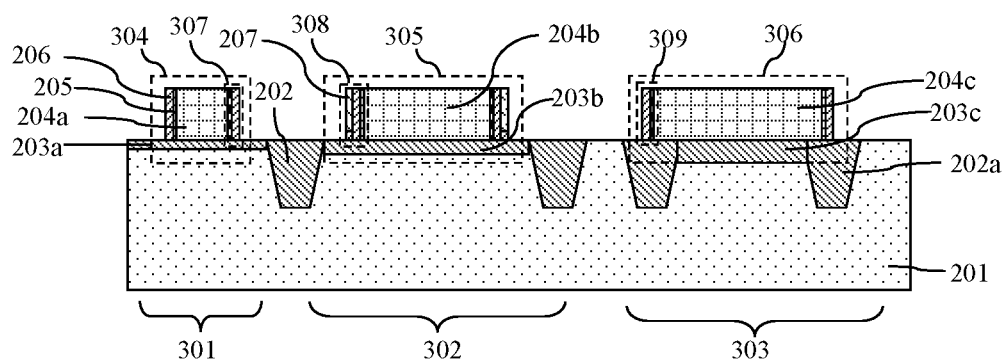
FIG. 2 is a structural schematic diagram of an integrated structure of MOS transistors having different working voltages according to an embodiment of the present application.
Figure 3:
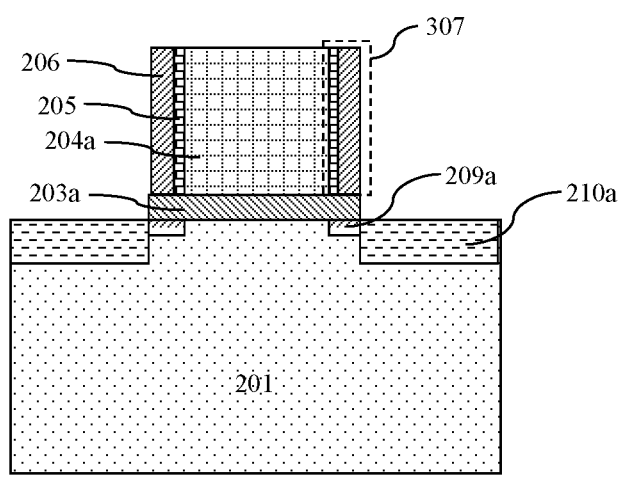
FIG. 3 is an enlarged diagram of the structure of a first MOS transistor in FIG. 2.
Figure 4:
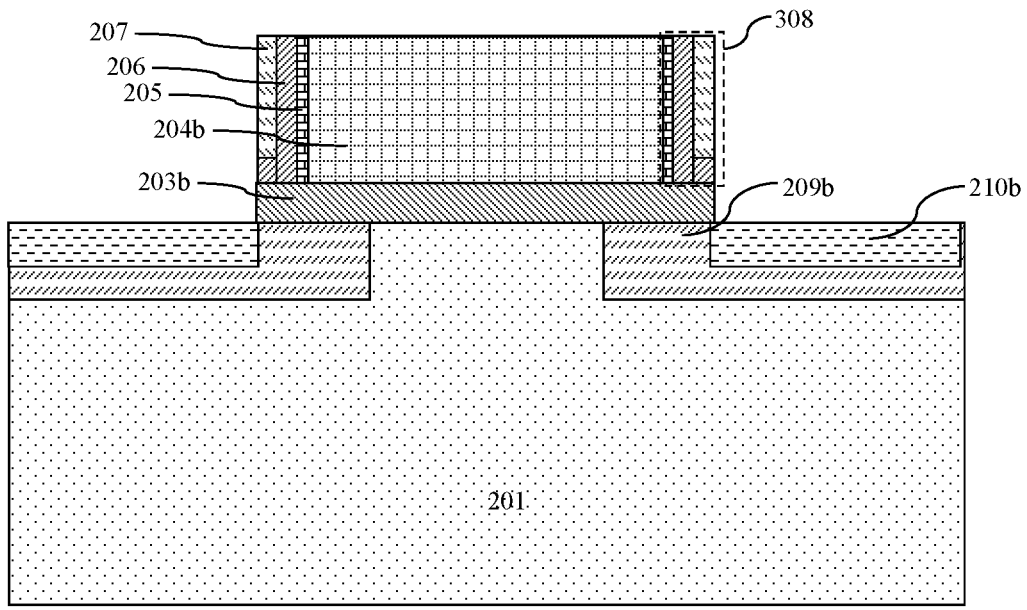
FIG. 4 is an enlarged diagram of the structure of a second MOS transistor in FIG. 2.

FIG. 2 is a structural schematic diagram of an integrated structure of MOS transistors having different working voltages according to an embodiment of the present application. FIG. 3 is an enlarged diagram of the structure of a first MOS transistor 304 in FIG. 2. FIG. 4 is an enlarged diagram of the structure of a second MOS transistor 305 in FIG. 2. In the integrated structure of MOS transistors having different working voltages of this embodiment of the present application, the first MOS transistor 304 having a first working voltage, the second MOS transistor 305 having a second working voltage, and a third MOS transistor 306 having a third working voltage are simultaneously integrated on a semiconductor substrate 201. The third working voltage is greater than the second working voltage, and the second working voltage is greater than the first working voltage. In this embodiment of the present application, the third working voltage is a high voltage, the second working voltage is a medium voltage, and the first working voltage is a low voltage.

In FIG. 2, a doped region formed on the semiconductor substrate 201 is not shown. The doped region of the semiconductor substrate 201 is shown in FIGS. 3 and 4.

A field oxide 202 is formed on the semiconductor substrate 201, and a region surrounded by the field oxide 202 forms an active region. In this embodiment of the present application, the field oxide 202 adopts shallow trench isolation (STI). In other embodiments, the field oxide 202 adopts local oxidation of silicon (LOCOS).

In FIG. 2, region 301 is a region for forming the first MOS transistor 304, region 302 is a region for forming the second MOS transistor 305, and region 303 is a region for forming the third MOS transistor 306.

The first MOS transistor 304 has a first gate structure, the second MOS transistor 305 has a second gate structure, and the third MOS transistor 306 has a third gate structure.

The first gate structure is formed by stacking a first gate dielectric layer 203a and a first gate conductive material layer 204a, the second gate structure is formed by stacking a second gate dielectric layer 203b and a second gate conductive material layer 204b, and the third gate structure is formed by stacking a third gate dielectric layer 203c and a third gate conductive material layer 204c.

The thickness of the second gate dielectric layer 203b is greater than the thickness of the first gate dielectric layer 203a, and the thickness of the third gate dielectric layer 203c is greater than the thickness of the second gate dielectric layer 203b.

A first spacer 307 formed by stacking a first sub-spacer 205 and a second sub-spacer 206 is formed on a side surface of the first gate structure in a self-aligned manner.

A second spacer 308 formed by stacking the first sub-spacer 205, the second sub-spacer 206, and a third sub-spacer 207 is formed on a side surface of the second gate structure in a self-aligned manner.

A third spacer 309 is formed on a side surface of the third gate structure in a self-aligned manner, the third spacer 309 being formed by stacking the first sub-spacer 205 and the second sub-spacer 206. In other embodiments, the third spacer 309 is formed by stacking the first sub-spacer 205, the second sub-spacer 206, and the third sub-spacer 207.

On the basis of the thickness of the first spacer 307, the thickness of the second spacer 308 is adjusted via the third sub-spacer 207, so as to ensure that a GIDL leakage of the second MOS transistor 305 under the second working voltage satisfies a requirement, wherein a smaller thickness of the second spacer 308 corresponds to a smaller GIDL leakage of the second MOS transistor 308.

Referring to FIG. 4, the second MOS transistor 305 further includes:
  a second drift region 209b formed in the semiconductor substrate 201 on two sides of the second gate structure, the second drift region 209b being self-aligned with a side surface of the first sub-spacer 205, and the second drift region 209b diffusing and extending to the bottom of the second gate structure; and
  a second source drain region 210b formed in the second drift region 209b on two sides of the second gate structure, the second source drain region 210 being self-aligned with a side surface of the second spacer 308, wherein a junction depth of the second drift region 209b is greater than a junction depth of the second source drain region 210b, and a doping concentration of the second source drain region 210b is greater than a doping concentration of the second drift region 209b.

In some embodiments, a condition where the GIDL leakage of the second MOS transistor 305 satisfies the requirement is that the GIDL leakage of the second MOS transistor 305 is less than 10 pA/μm.

Referring to FIG. 3, the first MOS transistor 305 further includes:
- a first light doped drain region 209a formed in the semiconductor substrate 201 on two sides of the first gate structure, the first light doped drain region 209a being self-aligned with the side surface of the first sub-spacer 205; and
- a first source drain region 210a formed in the semiconductor substrate 201 on two sides of the first gate structure, the first source drain region 210a being self-aligned with a side surface of the first spacer 307, wherein a junction depth of the first light doped drain region 209a is less than a junction depth of the first source drain region 210a, and a doping concentration of the first source drain region 210a is greater than a doping concentration of the first light doped drain region 209a.

The width of the first gate structure is less than the width of the second gate structure.

A spacing between the first gate structures is less than a spacing between the second gate structures.

In a region for forming the first MOS transistor 304, the first MOS transistors 304 are arranged periodically, and the thickness of the first spacer 307 ensures that the cell dimension of the first MOS transistor 304 in a channel length direction satisfies a requirement, so as to improve the integration of the first MOS transistors 304, wherein a smaller thickness of the first spacer 307 corresponds to a smaller cell dimension of the first MOS transistor 304 in the channel length direction.

In some embodiments, the first MOS transistor 304 can be applied in a storage region of an SRAM. When the cell dimension of the first MOS transistor 304 is reduced, more storage cells can be integrated in the same storage region.

The third MOS transistor 306 further includes:
- a third drift region formed in the semiconductor substrate 201 on two sides of the third gate structure, the third drift region being self-aligned with the side surface of the first sub-spacer 205, and the third drift region diffusing and extending to the bottom of the third gate structure; and
- a third source drain region formed in the third drift region, wherein a junction depth of the third drift region is greater than a junction depth of the third source drain region, and a doping concentration of the third source drain region is greater than a doping concentration of the third drift region.

A drift region field oxide 202a is formed in the third drift region between the third source drain region and the side surface of the third gate structure. The drift region field oxide 202a belongs to the field oxide 202. In FIG. 2, the mark 202a is used separately represent the drift region field oxide.

In this embodiment of the present application, the first gate conductive material layer 204a, the second gate conductive material layer 204b, and the third gate conductive material layer 204c are all polysilicon gates. In other embodiments, the first gate conductive material layer 204a, the second gate conductive material layer 204b, and the third gate conductive material layer 204c are metal gates.

The material of the first sub-spacer 205 includes silicon oxide. In some embodiments, the first sub-spacer 205 may be formed by oxidizing the polysilicon gate.

The material of the second sub-spacer 206 includes silicon nitride or a low dielectric constant material.

The material of the third sub-spacer 207 includes silicon oxide. In some embodiments, the silicon oxide of the third sub-spacer 207 is formed by means of an O3 TEOS process. In the O3 TEOS process, O3 is used as an oxygen source and TEOS is used as a silicon source to perform a reaction.

In this embodiment of the present application, the first MOS transistor 304 is not prone to a GIDL leakage because the first working voltage thereof is a low voltage. Although the third working voltage of the third MOS transistor 306 is a high voltage, the third MOS transistor 306 is not prone to a GIDL leakage problem because the drift region field oxide 202a is formed in the third drift region of the third MOS transistor 306. The second MOS transistor 305 is prone to a GIDL leakage problem because the second working voltage thereof is a medium voltage. However, this embodiment of the present application provides a special configuration for the structure of the second spacer 308 of the second MOS transistor 305, that is, the third sub-spacer 207 is added to the second spacer relative to the first spacer 307, thus increasing the thickness of the second spacer 308. By increasing the thickness of the second spacer 308, a spacing between the second source drain region 210b and the second gate structure can be increased, thus reducing the GIDL.

The second spacer 308 of the second MOS transistor 305 having the second working voltage is formed by adding the third sub-spacer 207 on the basis of the first spacer 307 including the first sub-spacer 205 and the second sub-spacer 206, of the first MOS transistor 304 having the first working voltage. The first sub-spacer 205 and the second sub-spacer 206 can ensure that the thickness of the first spacer 307 is relatively small, so that the dimension of the first MOS transistor 304 can be reduced and the device density of the region for forming the first MOS transistor 304 can be improved. In this case, the thickness of the second spacer 308 can be independently adjusted via the third sub-spacer 207, increasing the spacing between the second source drain region 210b and the second gate conductive material layer 204b of the second MOS transistor 305 and thus reducing the GIDL leakage of the second MOS transistor 305.

In this embodiment of the present application, the third sub-spacer 207 of the second MOS transistor 305 can be formed by adding a mask after deposition and full etching of the third sub-spacer 207 material layer and then performing wet etching.

In this embodiment of the present application, a DG layer mask can be used as the mask for forming the third sub-spacer 207 of the second MOS transistor 305, thus requiring no additional masks.

Figure 6:
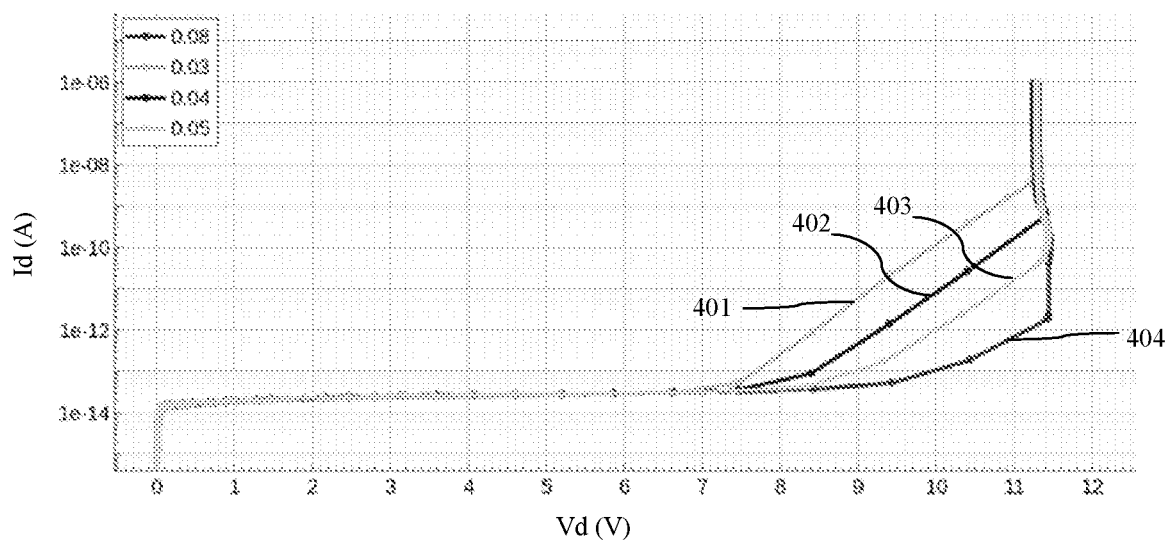
FIG. 6 is a simulation curve of Ioff of the second MOS transistor according to an embodiment of the present application.

FIG. 6 is a simulation curve of Ioff of the second MOS transistor according to an embodiment of the present application. The thickness of the second spacer 308 corresponding to curve 401 is 0.03 μm, the thickness of the second spacer 308 corresponding to curve 402 is 0.04 μm, the thickness of the second spacer 308 corresponding to curve 403 is 0.05 μm, and the thickness of the second spacer 308 corresponding to curve 404 is 0.08 μm. It can be seen that, under the same drain voltage Vd, Ioff corresponding to a drain current Id decreases successively, so the GIDL problem is improved with the increase of the thickness of the second spacer 308.

FIGS. 5A-5F are schematic diagrams of device structures in steps of a method for manufacturing an integrated structure of MOS transistors having different working voltages according to an embodiment of the present application. The method for manufacturing an integrated structure of MOS transistors having different working voltages according to an embodiment of the present application includes the following steps.

Figure 5A:
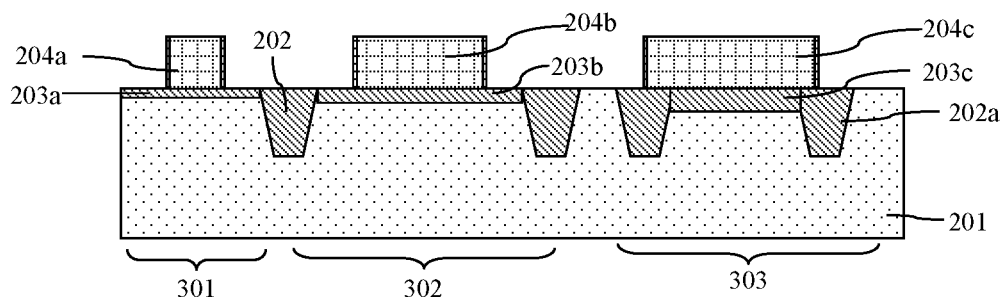
FIGS. 5A-5F are schematic diagrams of device structures in steps of a method for manufacturing an integrated structure of MOS transistors having different working voltages according to an embodiment of the present application.

Step 1. Referring to FIG. 5A, a first gate structure, a second gate structure, and a third gate structure are formed respectively in a region for forming a first MOS transistor 304, a region for forming a second MOS transistor 305, and a region for forming a third MOS transistor 306 on a semiconductor substrate 201.

In FIG. 5A, region 301 represents the region for forming the first MOS transistor 304, region 302 represents the region for forming the second MOS transistor 305, and region 303 represents the region for forming the third MOS transistor 306. A plurality of the first MOS transistors 304 are usually formed in the region 301, and only one of the first MOS transistors 304 is shown in FIG. 5A. Similarly, a plurality of second MOS transistors 305 are integrated in the region 302, and a plurality of third MOS transistors 306 are integrated in the region 303. For the structure with formation of the first MOS transistor 304, the second MOS transistor 305, and the third MOS transistor 306, reference may be made to FIG. 2.

The first MOS transistor 304 has a first working voltage, the second MOS transistor 305 has a second working voltage, and the third MOS transistor 306 has a third working voltage. The third working voltage is greater than the second working voltage, and the second working voltage is greater than the first working voltage.

The first gate structure is formed by stacking a first gate dielectric layer 203a and a first gate conductive material layer 204a, the second gate structure is formed by stacking a second gate dielectric layer 203b and a second gate conductive material layer 204b, and the third gate structure is formed by stacking a third gate dielectric layer 203c and a third gate conductive material layer 204c.

The thickness of the second gate dielectric layer 203b is greater than the thickness of the first gate dielectric layer 203a, and the thickness of the third gate dielectric layer 203c is greater than the thickness of the second gate dielectric layer 203b.

The first gate dielectric layer 203a, the second gate dielectric layer 203b, and the third gate dielectric layer 203c may be formed using an existing well-known process.

In the method of this embodiment of the present application, the first gate conductive material layer 204a, the second gate conductive material layer 204b, and the third gate conductive material layer 204c are all polysilicon gates and are formed simultaneously by means of polysilicon deposition and patterned etching processes. In methods of other embodiments, the first gate conductive material layer 204a, the second gate conductive material layer 204b, and the third gate conductive material layer 204c finally formed in FIG. 2 are metal gates; however in step 1, the first gate conductive material layer 204a, the second gate conductive material layer 204b, and the third gate conductive material layer 204c need to be replaced by polysilicon dummy gates, and after formation of the source drain region, the metal gate is replaced.

Step 2. Referring to FIG. 5A, a first sub-spacer 205 is formed on side surfaces of the first gate structure, the second gate structure, and the third gate structure.

In the method of this embodiment of the present application, the material of the first sub-spacer 205 includes silicon oxide. The first sub-spacer 205 can be formed by directly oxidizing the polysilicon gate. Since the first sub-spacers 205 of the first gate structure, the second gate structure, and the third gate structure are formed simultaneously using the same process at different positions, these sub-spacers are all represented by the mark 205.

Figure 5B:
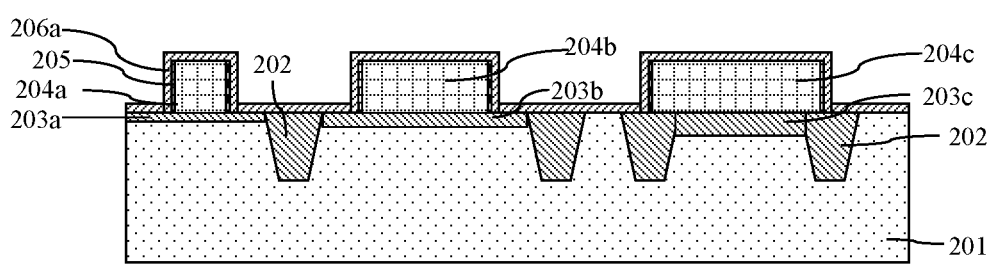

Step 3. Referring to FIG. 5B, a second sub-spacer material layer 206a is deposited. The second sub-spacer material layer 206a covers the top surface, side surface, and external surface of the first to third gate structures.

Figure 5C:
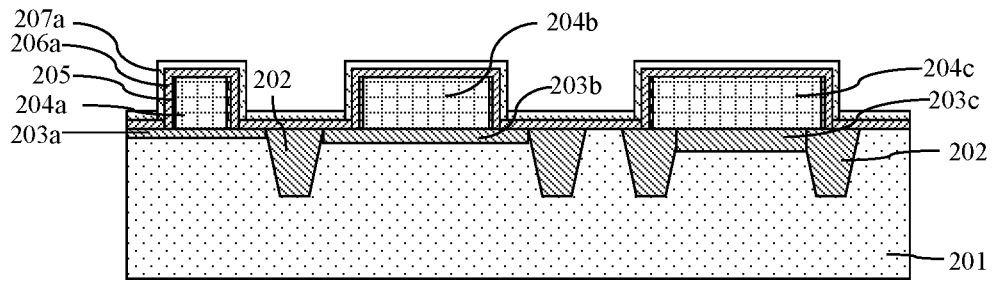

Referring to FIG. 5C, a third sub-spacer material layer 207a is deposited. The third sub-spacer material layer 207a is formed on the surface of the second sub-spacer material layer 206a.

In some embodiments, the material of the second sub-spacer 206 includes silicon nitride or a low dielectric constant material.

The material of the third sub-spacer 207 includes silicon oxide. The silicon oxide of the third sub-spacer 207 is formed by means of an O3 TEOS process. In the O3 TEOS process, o3 is used as an oxygen source and TEOS is used as a silicon source to perform a reaction.

Figure 5D:
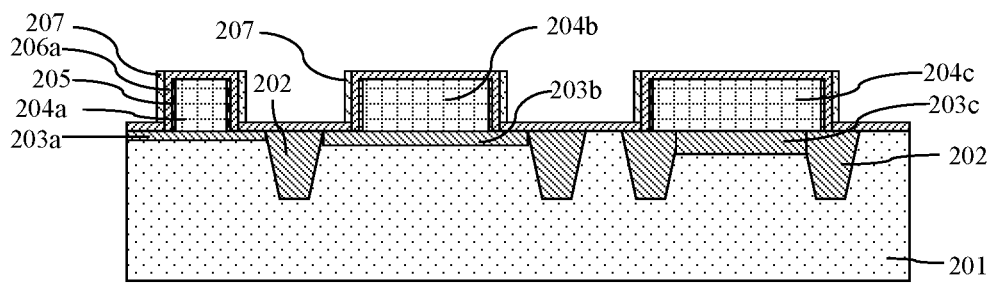

Step 5. Referring to FIG. 5D, the third sub-spacer material layer 207a is fully etched, such that the third sub-spacer material layer 207a is retained on the side surfaces of the first gate structure, the second gate structure, and the third gate structure in a self-aligned manner and forms a third sub-spacer 207.

Figure 5E:
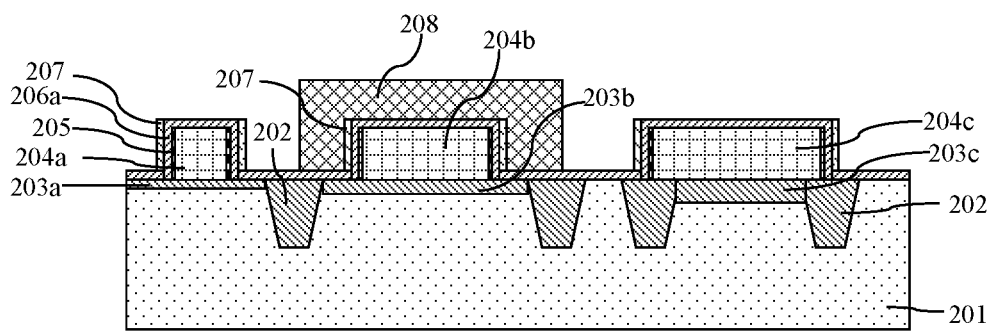

Step 6. Referring to FIG. 5E, a mask layer 208 is formed to cover the region for forming the second MOS transistor 305, open the region for forming the first MOS transistor 304, and cover or open the region for forming the third MOS transistor 306.

In this embodiment of the present application, the mask layer 208 can be composed of a photoresist formed by a photolithography process. In some example embodiments, a mask for defining a pattern structure of the mask layer 208 is a DG layer mask, i.e., a mask for defining a region for forming the second gate dielectric layer 203b, thus requiring no additional masks.

Figure 5F:
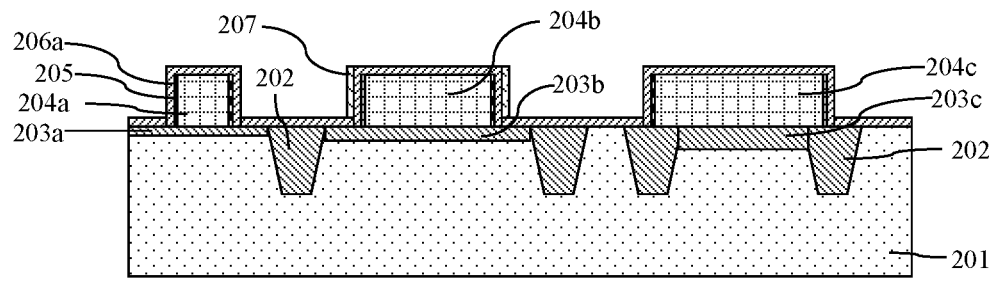

Step 7. Referring to FIG. 5F, wet etching is performed to fully remove the third sub-spacer 207 in an open region of the mask layer 208. The mask layer 208 is removed subsequently.

Step 8. Referring to FIG. 2, the second sub-spacer material layer 206a is fully etched, such that the second sub-spacer material layer 206a is retained on the side surfaces of the first gate structure, the second gate structure, and the third gate structure in a self-aligned manner and forms a second sub-spacer 206.

A first spacer 307 is formed by stacking the first sub-spacer 205 and the second sub-spacer 206 that are formed on the side surface of the first gate structure in a self-aligned manner.

A second spacer 308 is formed by stacking the first sub-spacer 208, the second sub-spacer 206, and the third sub-spacer 207 that are formed on the side surface of the second gate structure in a self-aligned manner.

The third spacer 309 is formed by stacking the first sub-spacer 205 and the second sub-spacer 206 or by stacking the first sub-spacer 205, the second sub-spacer 206, and the third sub-spacer 207.

On the basis of the thickness of the first spacer 307, the thickness of the second spacer 308 is adjusted via the third sub-spacer 207, so as to ensure that a GIDL leakage of the second MOS transistor 305 under the second working voltage satisfies a requirement, wherein a smaller thickness of the second spacer 308 corresponds to a smaller GIDL leakage of the second MOS transistor 305.

In this embodiment of the present application, a process of forming the second MOS transistor 305 further includes the following:

Referring to FIG. 4, after formation of the first sub-spacer 205 in step 2, a second drift region 209b is formed in the semiconductor substrate 201 on two sides of the second gate structure by means of ion implantation and annealing diffusion processes, wherein the ion implantation of the second drift region 209b uses a side surface of the first sub-spacer 205 as a self-alignment condition, and the second drift region 209b extends to the bottom of the second gate structure after the annealing diffusion.

After step 8, source drain implantation is performed to form a second source drain region 210b in the second drift region 209b on two sides of the second gate structure, the second source drain region 210b being self-aligned with a side surface of the second spacer 308, wherein a junction depth of the second drift region 209b is greater than a junction depth of the second source drain region 210b, and a doping concentration of the second source drain region 210b is greater than a doping concentration of the second drift region 209b.

A condition where the GIDL leakage of the second MOS transistor 305 satisfies the requirement is that the GIDL leakage of the second MOS transistor 305 is less than 10 pA/μm.

A process of forming the first MOS transistor 304 further includes the following:

Referring to FIG. 3, after formation of the first sub-spacer 205 in step 2, light doped drain implantation is performed to form a first light doped drain region 209a in the semiconductor substrate 201 on two sides of the first gate structure, wherein the light doped drain implantation of the first light doped drain region 209a uses the side surface of the first sub-spacer 205 as a self-alignment condition.

After step 8, source drain implantation is performed to form a first source drain region 210a in the semiconductor substrate 201 on two sides of the first gate structure, the first source drain region 210a being self-aligned with a side surface of the first spacer 307, wherein a junction depth of the first light doped drain region 209a is less than a junction depth of the first source drain region 210a, and a doping concentration of the first source drain region 210a is greater than a doping concentration of the first light doped drain region 209a.

The width of the first gate structure is less than the width of the second gate structure.

A spacing between the first gate structures is less than a spacing between the second gate structures.

In the region for forming the first MOS transistor 304, the first MOS transistors 304 are arranged periodically, and the thickness of the first spacer 307 ensures that the cell dimension of the first MOS transistor 304 in a channel length direction satisfies a requirement, so as to improve the integration of the first MOS transistors 304, wherein a smaller thickness of the first spacer 307 corresponds to a smaller cell dimension of the first MOS transistor 304 in the channel length direction.

The third MOS transistor 306 further includes the following:

Before step 1, a drift region field oxide 202a of the third MOS transistor 306 is formed on the semiconductor substrate 201.

After formation of the first sub-spacer 205 in step 2, a third drift region is formed in the semiconductor substrate 201 on two sides of the third gate structure by means of ion implantation and annealing diffusion processes, wherein the ion implantation of the third drift region uses the side surface of the first sub-spacer 205 as a self-alignment condition, and the third drift region extends to the bottom of the third gate structure after the annealing diffusion.

After step 8, source drain implantation is performed to form a third source drain region in the third drift region on two sides of the third gate structure, wherein a junction depth of the third drift region is greater than a junction depth of the third source drain region, and a doping concentration of the third source drain region is greater than a doping concentration of the third drift region. The drift region field oxide 202a is formed in the third drift region between the third source drain region and the side surface of the third gate structure.

The present application is described in detail above via specific embodiments, which, however, do not intended to limit the present application. Without departing from the principle of the present application, those skilled in the art can also make many other changes and improvements, which shall also be considered as the scope of protection the present application.

What is claimed is:

1. An integrated structure of metal-oxide-semiconductor (MOS) transistors having different working voltages, wherein a first MOS transistor having a first working voltage, a second MOS transistor having a second working voltage, and a third MOS transistor having a third working voltage are simultaneously integrated on a semiconductor substrate; the third working voltage is greater than the second working voltage, and the second working voltage is greater than the first working voltage;

the first MOS transistor has a first gate structure, the second MOS transistor has a second gate structure, and the third MOS transistor has a third gate structure;

the first gate structure is formed by stacking a first gate dielectric layer and a first gate conductive material layer, the second gate structure is formed by stacking a second gate dielectric layer and a second gate conductive material layer, and the third gate structure is formed by stacking a third gate dielectric layer and a third gate conductive material layer;

a thickness of the second gate dielectric layer is greater than a thickness of the first gate dielectric layer, and a thickness of the third gate dielectric layer is greater than the thickness of the second gate dielectric layer;

a first spacer formed by stacking a first sub-spacer and a second sub-spacer is formed on a side surface of the first gate structure in a self-aligned manner;

a second spacer formed by stacking the first sub-spacer, the second sub-spacer, and a third sub-spacer is formed on a side surface of the second gate structure in a self-aligned manner;

a third spacer is formed on a side surface of the third gate structure in a self-aligned manner, the third spacer being formed by stacking the first sub-spacer and the second sub-spacer or by stacking the first sub-spacer, the second sub-spacer, and the third sub-spacer; and on the basis of a thickness of the first spacer, a thickness of the second spacer is adjusted via the third sub-spacer, so as to ensure that a gate-induced drain leakage (GIDL) leakage of the second MOS transistor under the second working voltage satisfies a requirement, wherein a smaller thickness of the second spacer corresponds to a smaller GIDL leakage of the second MOS transistor.

2. The integrated structure of MOS transistors having different working voltages according to claim 1, wherein the second MOS transistor further comprises:

a second drift region formed in the semiconductor substrate on two sides of the second gate structure, the second drift region being self-aligned with a side surface of the first sub-spacer, and the second drift region diffusing and extending to the bottom of the second gate structure; and a second source drain region formed in the second drift region on two sides of the second gate structure, the second source drain region being self-aligned with a side surface of the second spacer, wherein a junction depth of the second drift region is greater than a junction depth of the second source drain region, and a doping concentration of the second source drain region is greater than a doping concentration of the second drift region.

3. The integrated structure of MOS transistors having different working voltages according to claim 2, wherein a condition where the GIDL leakage of the second MOS transistor satisfies the requirement is that the GIDL leakage of the second MOS transistor is less than 10 pA/µm.

4. The integrated structure of MOS transistors having different working voltages according to claim 2, wherein the first MOS transistor further comprises:

a first light doped drain region formed in the semiconductor substrate on two sides of the first gate structure, the first light doped drain region being self-aligned with the side surface of the first sub-spacer; and a first source drain region formed in the semiconductor substrate on two sides of the first gate structure, the first source drain region being self-aligned with a side surface of the first spacer, wherein a junction depth of the first light doped drain region is less than a junction depth of the first source drain region, and a doping concentration of the first source drain region is greater than a doping concentration of the first light doped drain region.

5. The integrated structure of MOS transistors having different working voltages according to claim 4, wherein a width of the first gate structure is less than a width of the second gate structure;

a spacing between the first gate structures is less than a spacing between the second gate structures; and in a region for forming the first MOS transistor, the first MOS transistors are arranged periodically, and the thickness of the first spacer ensures that a cell dimension of the first MOS transistor in a channel length direction satisfies a requirement, so as to improve the integration of the first MOS transistors, wherein a smaller thickness of the first spacer corresponds to a smaller cell dimension of the first MOS transistor in the channel length direction.

6. The integrated structure of MOS transistors having different working voltages according to claim 4, wherein the third MOS transistor further comprises:

a third drift region formed in the semiconductor substrate on two sides of the third gate structure, the third drift region being self-aligned with the side surface of the first sub-spacer, and the third drift region diffusing and extending to the bottom of the third gate structure; and a third source drain region formed in the third drift region, wherein a junction depth of the third drift region is greater than a junction depth of the third source drain region, and a doping concentration of the third source drain region is greater than a doping concentration of the third drift region; and a drift region field oxide is formed in the third drift region between the third source drain region and the side surface of the third gate structure.

7. The integrated structure of MOS transistors having different working voltages according to claim 1, wherein a material of the first sub-spacer comprises silicon oxide;

a material of the second sub-spacer comprises silicon nitride or a low dielectric constant material; and a material of the third sub-spacer comprises silicon oxide.

8. The integrated structure of MOS transistors having different working voltages according to claim 1, wherein the first gate conductive material layer, the second gate conductive material layer, and the third gate conductive material layer are all polysilicon gates or metal gates.

9. A method for manufacturing an integrated structure of metal-oxide-semiconductor (MOS) transistors having different working voltages, comprising the following steps:

step 1, forming a first gate structure, a second gate structure, and a third gate structure respectively in a region for forming a first MOS transistor, a region for forming a second MOS transistor, and a region for forming a third MOS transistor on a semiconductor substrate; wherein the first MOS transistor has a first working voltage, the second MOS transistor has a second working voltage, and the third MOS transistor has a third working voltage; the third working voltage is greater than the second working voltage, and the second working voltage is greater than the first working voltage;

the first gate structure is formed by stacking a first gate dielectric layer and a first gate conductive material layer, the second gate structure is formed by stacking a second gate dielectric layer and a second gate conductive material layer, and the third gate structure is formed by stacking a third gate dielectric layer and a third gate conductive material layer; and a thickness of the second gate dielectric layer is greater than a thickness of the first gate dielectric layer, and a thickness of the third gate dielectric layer is greater than the thickness of the second gate dielectric layer;

step 2, forming a first sub-spacer on side surfaces of the first gate structure, the second gate structure, and the third gate structure;

step 3, sequentially depositing a second sub-spacer material layer and a third sub-spacer material layer;

step 5, fully etching the third sub-spacer material layer, such that the third sub-spacer material layer is retained on the side surfaces of the first gate structure, the second gate structure, and the third gate structure in a self-aligned manner and forms a third sub-spacer;

step 6, forming a mask layer to cover the region for forming the second MOS transistor, open the region for forming the first MOS transistor, and cover or open the region for forming the third MOS transistor;

step 7, performing wet etching to fully remove the third sub-spacer in an open region of the mask layer; and step 8, fully etching the second sub-spacer material layer, such that the second sub-spacer material layer is retained on the side surfaces of the first gate structure, the second gate structure, and the third gate structure in a self-aligned manner and forms a second sub-spacer; wherein a first spacer is formed by stacking the first sub-spacer and the second sub-spacer that are formed on the side surface of the first gate structure in a self-aligned manner;

a second spacer is formed by stacking the first sub-spacer, the second sub-spacer, and the third sub-spacer that are formed on the side surface of the second gate structure in a self-aligned manner;

a third spacer is formed by stacking the first sub-spacer and the second sub-spacer or by stacking the first sub-spacer, the second sub-spacer, and the third sub-spacer; and on the basis of a thickness of the first spacer, a thickness of the second spacer is adjusted via the third sub-spacer, so as to ensure that a gate-induced drain leakage (GIDL) leakage of the second MOS transistor under the second working voltage satisfies a requirement, wherein a smaller thickness of the second spacer corresponds to a smaller GIDL leakage of the second MOS transistor.

10. The method for manufacturing the integrated structure of MOS transistors having different working voltages according to claim 9, wherein a process of forming the second MOS transistor further comprises:

after formation of the first sub-spacer in step 2, forming a second drift region in the semiconductor substrate on two sides of the second gate structure by means of ion implantation and annealing diffusion processes, wherein the ion implantation of the second drift region uses a side surface of the first sub-spacer as a self-alignment condition, and the second drift region extends to the bottom of the second gate structure after the annealing diffusion; and after step 8, performing source drain implantation to form a second source drain region in the second drift region on two sides of the second gate structure, the second source drain region being self-aligned with a side surface of the second spacer, wherein a junction depth of the second drift region is greater than a junction depth of the second source drain region, and a doping concentration of the second source drain region is greater than a doping concentration of the second drift region.

11. The method for manufacturing the integrated structure of MOS transistors having different working voltages according to claim 10, wherein a condition where the GIDL leakage of the second MOS transistor satisfies the requirement is that the GIDL leakage of the second MOS transistor is less than 10 pA/μm.

12. The method for manufacturing the integrated structure of MOS transistors having different working voltages according to claim 10, wherein a process of forming the first MOS transistor further comprises:

after formation of the first sub-spacer in step 2, performing light doped drain implantation to form a first light doped drain region in the semiconductor substrate on two sides of the first gate structure, wherein the light doped drain implantation of the first light doped drain region uses the side surface of the first sub-spacer as a self-alignment condition; and after step 8, performing source drain implantation to form a first source drain region in the semiconductor substrate on two sides of the first gate structure, the first source drain region being self-aligned with a side surface of the first spacer, wherein a junction depth of the first light doped drain region is less than a junction depth of the first source drain region, and a doping concentration of the first source drain region is greater than a doping concentration of the first light doped drain region.

13. The method for manufacturing the integrated structure of MOS transistors having different working voltages according to claim 12, wherein a width of the first gate structure is less than a width of the second gate structure;

a spacing between the first gate structures is less than a spacing between the second gate structures; and in the region for forming the first MOS transistor, the first MOS transistors are arranged periodically, and the thickness of the first spacer ensures that a cell dimension of the first MOS transistor in a channel length direction satisfies a requirement, so as to improve the integration of the first MOS transistors, wherein a smaller thickness of the first spacer corresponds to a smaller cell dimension of the first MOS transistor in the channel length direction.

14. The method for manufacturing the integrated structure of MOS transistors having different working voltages according to claim 12, wherein the third MOS transistor further comprises:

before step 1, forming a drift region field oxide of the third MOS transistor on the semiconductor substrate;

after formation of the first sub-spacer in step 2, forming a third drift region in the semiconductor substrate on two sides of the third gate structure by means of ion implantation and annealing diffusion processes, wherein the ion implantation of the third drift region uses the side surface of the first sub-spacer as a self-alignment condition, and the third drift region extends to the bottom of the third gate structure after the annealing diffusion; and after step 8, performing source drain implantation to form a third source drain region in the third drift region on two sides of the third gate structure, wherein a junction depth of the third drift region is greater than a junction depth of the third source drain region, and a doping concentration of the third source drain region is greater than a doping concentration of the third drift region; and the drift region field oxide is formed in the third drift region between the third source drain region and the side surface of the third gate structure.

15. The method for manufacturing the integrated structure of MOS transistors having different working voltages according to claim 9, wherein a material of the first sub-spacer comprises silicon oxide;

a material of the second sub-spacer comprises silicon nitride or a low dielectric constant material; and a material of the third sub-spacer comprises silicon oxide.

16. The method for manufacturing the integrated structure of MOS transistors having different working voltages according to claim 9, wherein in step 6, a mask for defining a region for forming the second gate dielectric layer in step 1 is used to define a pattern structure of the mask layer.

* * * * *